(12) United States Patent
Pallikkara Kuttiatoor et al.

(10) Patent No.: US 10,640,679 B2
(45) Date of Patent: May 5, 2020

(54) CMP COMPOSITIONS SELECTIVE FOR OXIDE AND NITRIDE WITH IMPROVED DISHING AND PATTERN SELECTIVITY

(71) Applicant: Cabot Microelectronics Corporation, Aurora, IL (US)

(72) Inventors: Sudeep Pallikkara Kuttiatoor, Aurora, IL (US); Charles Hamilton, Forest Park, IL (US); Kevin P. Dockery, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 15/784,949

(22) Filed: Oct. 16, 2017

(65) Prior Publication Data

US 2018/0105721 A1  Apr. 19, 2018

Related U.S. Application Data

(60) Provisional application No. 62/409,247, filed on Oct. 17, 2016.

(51) Int. Cl.
| | | |
|---|---|---|
| *C09G 1/02* | (2006.01) | |
| *H01L 21/306* | (2006.01) | |
| *H01L 21/3105* | (2006.01) | |
| *H01L 21/321* | (2006.01) | |

(52) U.S. Cl.
CPC .......... *C09G 1/02* (2013.01); *H01L 21/30625* (2013.01); *H01L 21/31053* (2013.01); *H01L 21/3212* (2013.01)

(58) Field of Classification Search
None
See application file for complete search history.

(56) References Cited

U.S. PATENT DOCUMENTS

| | | |
|---|---|---|
| 6,520,840 B1 | 2/2003 | Wang et al. |
| 7,217,989 B2 | 5/2007 | Hiramitsu et al. |
| 7,442,645 B2 | 10/2008 | Carter et al. |
| 8,273,142 B2* | 9/2012 | White ............... H01L 21/02024 438/689 |
| 9,422,455 B2* | 8/2016 | Pallikkara Kuttiatoor ................ C09G 1/02 |
| 9,583,359 B2 | 2/2017 | Mishra et al. |
| 2005/0076580 A1* | 4/2005 | Tamboli ................... C09G 1/02 51/307 |
| 2014/0346140 A1 | 11/2014 | Dockery et al. |
| 2015/0102012 A1 | 4/2015 | Reiss et al. |
| 2017/0183538 A1 | 6/2017 | Kwon et al. |
| 2017/0194160 A1* | 7/2017 | Pallikkara Kuttiatoor ................ H01L 21/31053 |
| 2017/0298253 A1* | 10/2017 | Ishida ..................... C09G 1/02 |

OTHER PUBLICATIONS

Korean Intellectual Property Office as ISA, Search Report and Written Opinion of the International Searching Authority issued in connection with Application No. PCT/US2017/056809 dated May 31, 2018.

* cited by examiner

*Primary Examiner* — Shamim Ahmed
(74) *Attorney, Agent, or Firm* — Thomas Omholt; Erika S. Wilson; Francis J. Koszyk

(57) ABSTRACT

The invention provides a chemical-mechanical polishing composition containing a ceria abrasive, a polyhydroxy aromatic carboxylic acid, an ionic polymer of formula I:

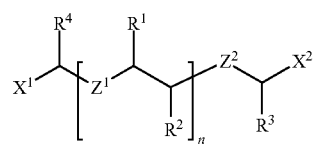

Figure 1:
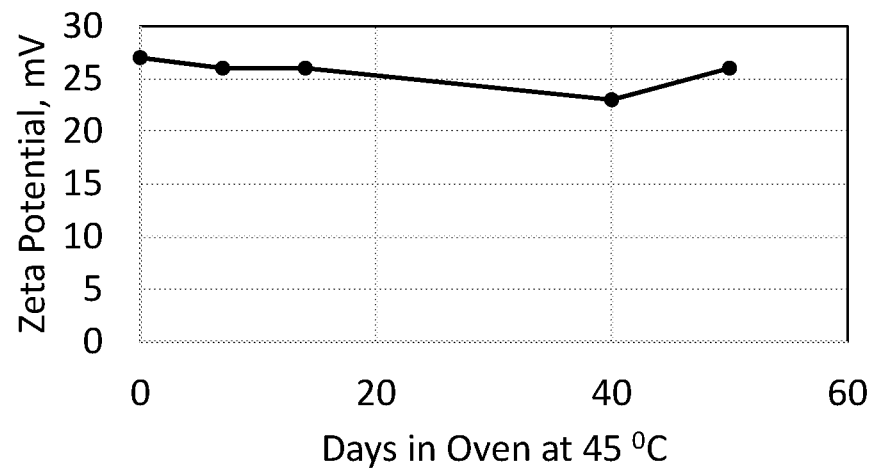

wherein $X^1$ and $X^2$, $Z^1$ and $Z^2$, $R^1$, $R^2$, $R^3$, and $R^4$, and n are as defined herein, and water, wherein the polishing composition has a pH of about 1 to about 4.5. The invention further provides a method of chemically-mechanically polishing a substrate with the inventive chemical-mechanical polishing composition. Typically, the substrate contains silicon oxide, silicon nitride, and/or polysilicon.

23 Claims, 1 Drawing Sheet

CMP COMPOSITIONS SELECTIVE FOR OXIDE AND NITRIDE WITH IMPROVED DISHING AND PATTERN SELECTIVITY

BACKGROUND OF THE INVENTION

Compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. Polishing compositions are typically used in conjunction with polishing pads (e.g., a polishing cloth or disk). Instead of, or in addition to, being suspended in the polishing composition, the abrasive material may be incorporated into the polishing pad.

As a method for isolating elements of a semiconductor device, a great deal of attention is being directed towards a shallow trench isolation (STI) process where a silicon nitride layer is formed on a silicon substrate, shallow trenches are formed via etching or photolithography, and a dielectric layer (e.g., an oxide) is deposited to fill the trenches. Due to variation in the depth of trenches, or lines, formed in this manner, it is typically necessary to deposit an excess of dielectric material on top of the substrate to ensure complete filling of all trenches. The excess dielectric material is then typically removed by a chemical-mechanical planarization process to expose the silicon nitride layer. When the silicon nitride layer is exposed, the largest area of the substrate exposed to the chemical-mechanical polishing composition comprises silicon nitride, which must then be polished to achieve a highly planar and uniform surface.

Generally, past practice has been to emphasize selectivity for oxide polishing in preference to silicon nitride polishing. Thus, the silicon nitride layer has served as a stopping layer during the chemical-mechanical planarization process, as the overall polishing rate decreased upon exposure of the silicon nitride layer. Many current slurries provide moderate oxide rates and moderate selectivities, limiting their usefulness. For example, low to moderate polishing rates can limit throughput, while low to moderate oxide/nitride selectivities limit the usefulness of the current slurry technologies to larger structures with thicker silicon nitride coatings.

Recently, selectivity for oxide polishing in preference to polysilicon polishing has also been emphasized. For example, the addition of a series of BRIJ™ and polyethylene oxide surfactants, as well as PLURONIC™ L-64, an ethylene oxide-propylene oxide-ethylene oxide triblock copolymer with an HLB of 15, is purported to increase the polishing selectivity of oxide to polysilicon (see Lee et al., Effects of Nonionic Surfactants on Oxide-to-Polysilicon Selectivity during Chemical Mechanical Polishing, *J. Electrochem. Soc.*, 149(8): G477-G481 (2002)). Also, U.S. Pat. No. 6,626,968 discloses that polishing selectivity of silicon oxide to polysilicon can be improved through the use of a polymer additive having hydrophilic and hydrophobic functional groups selected from polyvinylmethylether, polyethylene glycol, polyoxyethylene 23 lauryl ether, polypropanoic acid, polyacrylic acid, and polyether glycol bis (ether).

The STI substrate is typically polished using a conventional polishing medium and an abrasive-containing polishing composition. However, polishing STI substrates with conventional polishing media and abrasive-containing polishing compositions has been observed to result in overpolishing of the substrate surface or the formation of recesses in the STI features and other topographical defects such as microscratches on the substrate surface. This phenomenon of overpolishing and forming recesses in the STI features is referred to as dishing. Dishing is undesirable because dishing of substrate features may detrimentally affect device fabrication by causing failure of isolation of transistors and transistor components from one another, thereby resulting in short-circuits. Additionally, overpolishing of the substrate may also result in oxide loss and exposure of the underlying oxide to damage from polishing or chemical activity, which detrimentally affects device quality and performance.

Thus, there remains a need in the art for polishing compositions and methods that can provide desirable selectivity of silicon oxide, silicon nitride, and polysilicon and that have suitable removal rates, low defectivity, and suitable dishing performance.

BRIEF SUMMARY OF THE INVENTION

The invention provides a chemical-mechanical polishing composition comprising (a) a wet-process ceria abrasive, (b) a polyhydroxy aromatic carboxylic acid, (c) optionally an ionic polymer of formula (I):

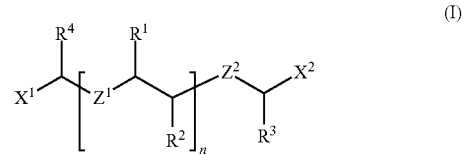

wherein $X^1$ and $X^2$ are independently selected from hydrogen, —OH, and —COOH and wherein at least one of $X^1$ and $X^2$ is —COOH, $Z^1$ and $Z^2$ are independently O or S, $R^1$, $R^2$, $R^3$, and $R^4$ are independently selected from hydrogen, $C_1$-$C_6$ alkyl, and $C_7$-$C_{10}$ aryl, and n is an integer of 3 to 500, and (d) water, wherein the polishing composition has a pH of about 1 to about 4.5.

The invention also provides a method of chemically-mechanically polishing a substrate comprising (i) providing a substrate, (ii) providing a polishing pad, (iii) providing a chemical-mechanical polishing composition comprising (a) a wet-process ceria abrasive, (b) a polyhydroxy aromatic carboxylic acid, (c) an ionic polymer of formula (I):

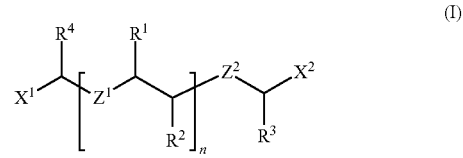

wherein $X^1$ and $X^2$ are independently selected from hydrogen, —OH, and —COOH, $Z^1$ and $Z^2$ are independently O or S, $R^1$, $R^2$, $R^3$, and $R^4$ are independently selected from hydrogen, $C_1$-$C_6$ alkyl, and $C_7$-$C_{10}$ aryl, and n is an integer of 3 to 500, and (d) water, wherein the polishing composition has a pH of about 1 to about 4.5, (iv) contacting the substrate with the polishing pad and the polishing composition, (v) moving the polishing pad and the chemical-mechanical polishing composition relative to the substrate to abrade at least a portion of the substrate to polish the substrate.

The invention further provides a chemical-mechanical polishing composition comprising (a) a wet-process ceria abrasive, (b) a polyhydroxy aromatic carboxylic acid, and (c) water, wherein the polishing composition has a pH of about 1 to about 4.5.

The invention additionally provides a method of chemically-mechanically polishing a substrate comprising (i) providing a substrate, (ii) providing a polishing pad, (iii) providing the chemical-mechanical polishing composition comprising (a) a wet-process ceria abrasive, (b) a polyhydroxy aromatic carboxylic acid, and (c) water, wherein the polishing composition has a pH of about 1 to about 4.5, (iv) contacting the substrate with the polishing pad and the polishing composition, and (v) moving the polishing pad and the chemical-mechanical polishing composition relative to the substrate to abrade at least a portion of the substrate to polish the substrate.

BRIEF DESCRIPTION OF THE SEVERAL VIEWS OF THE DRAWING(S)

FIG. 1 graphically illustrates the zeta potential over time of an exemplary polishing composition during storage at 45° C.

Figure 2:
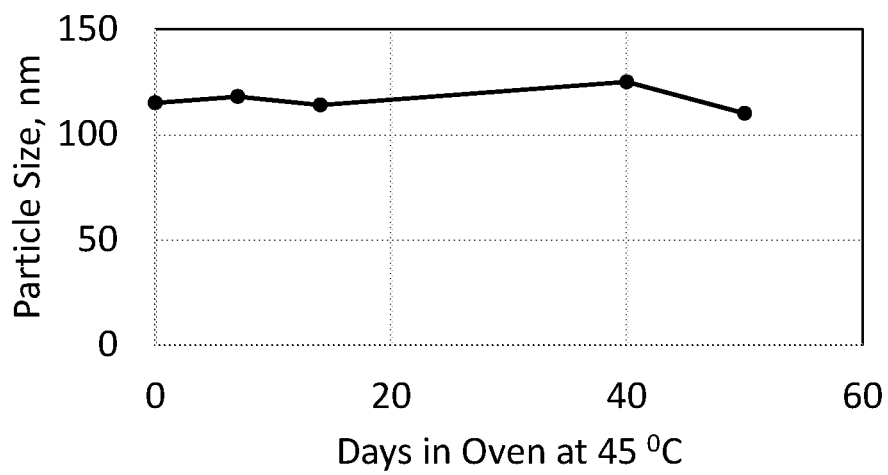

FIG. 2 graphically illustrates the particle size of wet-process ceria over time of an exemplary polishing composition during storage at 45° C.

DETAILED DESCRIPTION OF THE INVENTION

The invention provides a chemical-mechanical polishing composition comprising, consisting essentially of, or consisting of (a) a wet-process ceria abrasive, and (b) a polyhydroxy aromatic carboxylic acid.

In one embodiment, the invention further comprises an ionic polymer of formula (I):

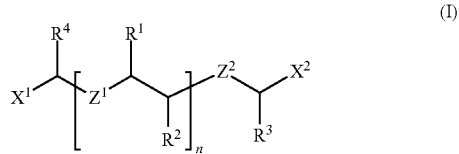

wherein $X^1$ and $X^2$ are independently selected from hydrogen, —OH, and —COOH and wherein at least one of $X^1$ and $X^2$ is —COOH, $Z^1$ and $Z^2$ are independently O or S, $R^1$, $R^2$, $R^3$, and $R^4$ are independently selected from hydrogen, $C_1$-$C_6$ alkyl, and $C_7$-$C_{10}$ aryl, and n is an integer of 3 to 500, and (d) water, wherein the polishing composition has a pH of about 1 to about 4.5.

In another embodiment of the invention, the invention provides a chemical-mechanical polishing composition comprising, consisting essentially of, or consisting of (a) a wet-process ceria abrasive, (b) a polyhydroxy aromatic carboxylic acid, and (c) a nonionic polymer.

The nonionic polymer can be any water soluble polymer known to those skilled in the art. The nonionic polymer can be used alone, or in combination with another nonionic polymer, and in any suitable concentration. Specific examples of nonionic polymers useful to the invention include polyethylene glycols and polyvinyl alcohols including branched polyvinyl alcohols.

The chemical-mechanical polishing composition comprises a ceria abrasive. As known to one of ordinary skill in the art, ceria is an oxide of the rare earth metal cerium, and is also known as ceric oxide, cerium oxide (e.g., cerium(IV) oxide), or cerium dioxide. Cerium(IV) oxide ($CeO_2$) can be formed by calcining cerium oxalate or cerium hydroxide. Cerium also forms cerium(III) oxides such as, for example, $Ce_2O_3$. The ceria abrasive can be any one or more of these or other oxides of ceria.

The ceria abrasive can be of any suitable type. Preferably, the ceria abrasive is a wet-process ceria abrasive. As used herein, "wet-process" ceria refers to a ceria prepared by a precipitation, condensation-polymerization, or similar process (as opposed to, for example, fumed or pyrogenic ceria). A polishing composition of the invention comprising a wet-process ceria abrasive has been found to exhibit low defects when used to polish substrates according to a method of the invention. Without wishing to be bound by any particular theory, it is believed that wet-process ceria comprises spherical ceria particles and/or smaller aggregate ceria particles, thereby resulting in low substrate defectivity when used in the inventive method. An illustrative wet-process ceria is HC-60™ ceria, commercially available from Rhodia.

The ceria particles can have any suitable average size (i.e., average particle diameter). The particle size of a particle is the diameter of the smallest sphere that encompasses the particle. If the average particle size of the ceria particles is too small, the polishing composition may not exhibit sufficient removal rate. In contrast, if the average particle size of the ceria particles is too large, the polishing composition may exhibit undesirable polishing performance such as, for example, poor substrate defectivity. Accordingly, the ceria particles can have an average particle size of about 10 nm or more, for example, about 15 nm or more, about 20 nm or more, about 25 nm or more, about 30 nm or more, about 35 nm or more, about 40 nm or more, about 45 nm or more, or about 50 nm or more. Alternatively, or in addition, the ceria particles can have an average particle size of about 1,000 nm or less, for example, about 750 nm or less, about 500 nm or less, about 250 nm or less, about 150 nm or less, about 100 nm or less, about 75 nm or less, or about 50 nm or less. Thus, the ceria particles can have an average particle size bounded by any two of the aforementioned endpoints. For example, the ceria particles can have an average particle size of about 10 nm to about 1,000 nm, about 10 nm to about 750 nm, about 15 nm to about 500 nm, about 20 nm to about 250 nm, about 20 nm to about 150 nm, about 25 nm to about 150 nm, about 25 nm to about 100 nm, or about 50 nm to about 150 nm, or about 50 nm to about 100 nm. For non-spherical ceria particles, the size of the particle is the diameter of the smallest sphere that encompasses the particle. The particle size of the ceria particles can be measured using any suitable technique, for example, using laser diffraction techniques. Suitable particle size measurement instruments are available from, e.g., Horiba Scientific (Horiba Ltd, Japan).

The ceria particles preferably are colloidally stable in the inventive polishing composition. The term colloid refers to the suspension of ceria particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., {[B]−[T]}/[C]≤0.5). More preferably, the value of [B]−[T]/[C] is less than or equal to 0.3, and most preferably is less than or equal to 0.1.

The polishing composition can comprise any suitable concentration of ceria abrasive. If the polishing composition of the invention comprises too little ceria abrasive, the composition may not exhibit sufficient removal rate. In contrast, if the polishing composition comprises too much ceria abrasive, the composition may exhibit undesirable polishing performance may not be cost effective, and/or may lack stability. The polishing composition can comprise about 10 wt. % or less of ceria, for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, about 0.9 wt. % or less, about 0.8 wt. % or less, about 0.7 wt. % or less, about 0.6 wt. % or less, or about 0.5 wt. % or less. Alternatively, or in addition, the polishing composition can comprise about 0.1 wt. % or more of ceria, for example, about 0.2 wt. % or more, about 0.3 wt. % or more, about 0.4 wt. % or more, about 0.5 wt. % or more, or about 1 wt. % or more. Thus, the polishing composition can comprise ceria in a concentration bounded by any two of the aforementioned endpoints. For example, the polishing composition can comprise about 0.1 wt. % to about 10 wt. % of ceria, e.g., about 0.1 wt. % to about 9 wt. % of ceria, about 0.1 wt. % to about 8 wt. % of ceria, about 0.1 wt. % to about 7 wt. % of ceria, about 0.1 wt. % to about 6 wt. % of ceria, about 0.1 wt. % to about 5 wt. % of ceria, about 0.1 wt. % to about 4 wt. % of ceria, about 0.1 wt. % to about 3 wt. % of ceria, about 0.1 wt. % to about 2 wt. % of ceria, about 0.1 wt. % to about 1 wt. % of ceria, about 0.2 wt. % to about 2 wt. % of ceria, about 0.2 wt. % to about 1 wt. % of ceria, or about 0.3 wt. % to about 0.5 wt. % of ceria. In an embodiment, the polishing composition comprises, at point-of-use, about 0.2 wt. % to about 0.6 wt. % of ceria, e.g., about 0.3 wt. % to about 0.5 wt. % of ceria, or about 0.4 wt. % of ceria. In another embodiment, the polishing composition comprises, as a concentrate, about 2 wt. % to about 3 wt. % of ceria, e.g., about 2.2 wt. % to about 2.8 wt. % of ceria, about 2.3 wt. % to about 2.6 wt. % of ceria, or about 2.4 wt. % of ceria.

The chemical-mechanical polishing composition comprises a polyhydroxy aromatic carboxylic acid. The polyhydroxy aromatic carboxylic acid can be any suitable polyhydroxy aromatic carboxylic acid. Typically, the polyhydroxy aromatic carboxylic acid is a dihydroxy aromatic carboxylic acid. Non-limiting examples of suitable polyhydroxy aromatic carboxylic acids include 2,4-dihydroxybenzoic acid, 2,6-dihydroxybenzoic acid, 3,4-dihydroxybenzoic acid, 3,5-dihydroxybenzoic acid, and 2,3-dihydroxybenzoic acid. Preferably, the polyhydroxy aromatic carboxylic acid is 3,4-dihydroxybenzoic acid or 3,5-dihydroxybenzoic acid.

The polishing composition comprises any suitable concentration of polyhydroxy aromatic carboxylic acid at the point-of-use. The polishing composition can comprise about 1 ppm or more of the polyhydroxy aromatic carboxylic acid, for example, about 5 ppm or more, about 10 ppm or more, about 15 ppm or more, about 20 ppm or more, about 25 ppm or more, about 30 ppm or more, about 35 ppm or more, about 40 ppm or more, about 45 ppm or more, or about 50 ppm or more. Alternatively, or in addition, the polishing composition can comprise about 500 ppm or less of the polyhydroxy aromatic carboxylic acid, for example, about 450 ppm or less, about 400 ppm or less, about 350 ppm or less, about 300 ppm or less, about 250 ppm or less, or about 200 ppm or less, of the polyhydroxy aromatic carboxylic acid. Thus, the polishing composition can comprise the polyhydroxy aromatic carboxylic acid in an amount bounded by any two of the aforementioned endpoints. For example, the polishing composition can comprise about 1 ppm to about 500 ppm, about 10 ppm to about 500 ppm, about 20 ppm to about 500 ppm, about 50 ppm to about 500 ppm, about 50 ppm to about 450 ppm, about 50 ppm to about 400 ppm, about 50 ppm to about 350 ppm, about 50 ppm to about 300 ppm, about 50 ppm to about 250 ppm, or about 50 ppm to about 200 ppm.

The chemical-mechanical polishing composition comprises an ionic polymer of formula I as described herein.

In certain embodiments, the ionic polymer is of formula I wherein $X^1$ and $X^2$ are both —COOH. In certain embodiments, the ionic polymer is of formula I wherein $Z^1$ and $Z^2$ are both O, and each of $R^1$, $R^2$, $R^3$, and $R^4$ is hydrogen. In certain preferred embodiments, the ionic polymer is of formula I wherein $X^1$ and $X^2$ are both —COOH, $Z^1$ and $Z^2$ are both O, and each of $R^1$, $R^2$, $R^3$, and $R^4$ is hydrogen.

The ionic polymer can have any suitable average molecular weight. The ionic polymer can have an average molecular weight of about 250 g/mol or more, for example, about 300 g/mol or more, about 400 g/mol or more, about 500 g/mol or more, about 600 g/mol or more, about 750 g/mol or more, about 1,000 g/mol or more, about 1,500 g/mol or more, about 2,000 g/mol or more, about 2,500 g/mol or more, about 3,000 g/mol or more, about 3,500 g/mol or more, about 4,000 g/mol or more, about 4,500 g/mol or more, about 5,000 g/mol or more, about 5,500 g/mol or more, about 6,000 g/mol or more, about 6,500 g/mol or more, about 7,000 g/mol or more, or about 7,500 g/mol or more. Alternatively, or in addition, the ionic polymer can have an average molecular weight of about 15,000 g/mol or less, for example, about 14,000 g/mol or less, about 13,000 g/mol or less, about 12,000 g/mol or less, about 11,000 g/mol or less, about 10,000 g/mol or less, about 9,000 g/mol or less, about 8,000 g/mol or less, about 7,500 g/mol or less, about 7,000 g/mol or less, about 6,500 g/mol or less, about 6,000 g/mol or less, about 5,500 g/mol or less, about 5,000 g/mol or less, about 4,500 g/mol or less, about 4,000 g/mol or less, about 3,500 g/mol or less, about 3,000 g/mol or less, about 2,500 g/mol or less, or about 2,000 g/mol or less. Thus, the ionic polymer can have an average molecular weight bounded by any two of the aforementioned endpoints. For example, the ionic polymer can have an average molecular weight of about 250 g/mol e.g., to about 15,000 g/mol, about 250 g/mol to about 14,000 g/mol, about 250 g/mol to about 13,000 g/mol, about 250 g/mol to about 12,000 g/mol, about 250 g/mol to about 11,000 g/mol, about 250 g/mol to about 10,000 g/mol, about 400 g/mol to about 10,000 g/mol, about 400 g/mol to about 8,000 g/mol, about 400 g/mol to about 6,000 g/mol, about 400 g/mol to about 4,000 g/mol, or about 400 g/mol to about 2,000 g/mol.

The polishing composition comprises any suitable amount of ionic polymer at the point-of-use. The polishing composition can comprise about 0.001 wt. % or more of ionic polymer, for example, about 0.005 wt. % or more, about 0.01 wt. % or more, about 0.025 wt. % or more, about 0.05 wt. % or more, about 0.075 wt. % or more, or about 0.1 wt. % or more, polymer at the point-of-use. Alternatively, or in addition, the polishing composition can comprise about 1 wt. % or less of the ionic polymer, for example, about 0.9 wt. % or less, about 0.8 wt. % or less, about 0.7 wt. % or less, about 0.6 wt. % or less, about 0.5 wt. % or less, about 0.4 wt. % or less, or about 0.3 wt. % or less at the point-of-use. Thus, the polishing composition can comprise the ionic polymer in an amount bounded by any two of the aforementioned endpoints. For example, the polishing composition can comprise about 0.001 wt. % to about 1 wt. % of ionic polymer at the point-of-use, about 0.01 wt. % to about 0.9 wt. %, about 0.025 wt. % to about 0.8 wt. %, about 0.05 wt. % to about 0.7 wt. %, or about 0.1 wt. % to about 0.5 wt. % of the ionic polymer.

The chemical-mechanical polishing composition optionally comprises one or more polyvinyl alcohols. The polyvinyl alcohol can be any suitable polyvinyl alcohol and can be a linear or branched polyvinyl alcohol. Non-limiting examples of suitable branched polyvinyl alcohols are the Nichigo G-polymers, such as the OKS-1009™ and OKS-1083™ products, available from Nippon Gohsei, Japan.

The polyvinyl alcohol can have any suitable degree of hydrolysis. The degree of hydrolysis refers to the amount of free hydroxyl groups present on the polyvinyl alcohol as compared to the sum of free hydroxyl groups and acetylated hydroxyl groups. Preferably, the polyvinyl alcohol has a degree of hydrolysis of about 90% or more, e.g., about 92% or more, about 94% or more, about 96% or more, about 98% or more, or about 99% or more.

The polyvinyl alcohol can have any average suitable molecular weight. For example, the polyvinyl alcohol can have an average molecular weight of about 250 g/mol or more, e.g., about 300 g/mol or more, about 400 g/mol or more, about 500 g/mol or more, about 600 g/mol or more, about 750 g/mol or more, about 1,000 g/mol or more, about 2,000 g/mol or more, about 3,000 g/mol or more, about 4,000 g/mol or more, about 5,000 g/mol or more, about 7,500 g/mol or more, about 10,000 g/mol or more, about 15,000 g/mol or more, about 20,000 g/mol or more, about 25,000 g/mol or more, about 30,000 g/mol or more, about 50,000 g/mol or more, or about 75,000 g/mol or more. Alternatively, or in addition, the polyvinyl alcohol can have an average molecular weight of about 250,000 g/mol or less, e.g., about 200,000 g/mol or less, about 180,000 g/mol or less, about 150,000 g/mol or less, about 100,000 g/mol or less, about 90,000 g/mol or less, about 85,000 g/mol or less, about 80,000 g/mol or less, about 75,000 g/mol or less, about 50,000 g/mol or less, about 45,000 g/mol or less, about 40,000 g/mol or less, about 35,000 g/mol or less, about 30,000 g/mol or less, about 25,000 g/mol or less, about 20,000 g/mol or less, about 15,000 g/mol or less, about 12,500 g/mol or less, or about 10,000 g/mol or less. Thus, the polyvinyl alcohol can have an average molecular weight bounded by any two of the aforementioned endpoints. For example, the polyvinyl alcohol can have an average molecular weight of about 250 g/mol to about 250,000 g/mol, e.g., about 250 g/mol to about 200,000 g/mol, about 250 g/mol to about 180,000 g/mol, about 250 g/mol to about 150,000 g/mol, about 250 g/mol to about 100,000 g/mol, about 250 g/mol to about 75,000 g/mol, about 250 g/mol to about 50,000 g/mol, about 250 g/mol to about 25,000 g/mol, about 250 g/mol to about 10,000 g/mol, about 10,000 g/mol to about 100,000 g/mol, about 10,000 g/mol to about 75,000 g/mol, about 10,000 g/mol to about 50,000 g/mol, about 10,000 g/mol to about 40,000 g/mol, about 50,000 g/mol to about 100,000 g/mol, about 75,000 g/mol to about 100,000 g/mol, about 25,000 g/mol to about 200,000 g/mol, or about 50,000 g/mol to about 180,000 g/mol, and the like.

The polishing composition comprises any suitable amount of polyvinyl alcohol at the point-of-use. For example, the polishing composition can comprise about 0.001 wt. % or more of the polyvinyl alcohol at the point-of-use, e.g., about 0.005 wt. % or more, about 0.01 wt. % or more, about 0.025 wt. % or more, about 0.05 wt. % or more, about 0.075 wt. % or more, or about 0.1 wt. % or more. Alternatively, or in addition, the polishing composition can comprise about 1 wt. % or less of the polyvinyl alcohol at the point-of-use, e.g., about 0.9 wt. % or less, about 0.8 wt. % or less, about 0.7 wt. % or less, about 0.6 wt. % or less, about 0.5 wt. % or less, about 0.4 wt. % or less, or about 0.3 wt. % or less. Thus, the polishing composition can comprise the ionic polymer in an amount bounded by any two of the aforementioned endpoints. For example, the polishing composition can comprise about 0.001 wt. % to about 1 wt. % of the polyvinyl alcohol at the point-of-use, about 0.01 wt. % to about 0.9 wt. %, e.g., about 0.025 wt. % to about 0.8 wt. %, about 0.05 wt. % to about 0.7 wt. %, or about 0.1 wt. % to about 0.5 wt. % of the polyvinyl alcohol.

The polishing composition optionally comprises one or more polyethylene glycols. The polyethylene glycol can be any suitable polyethylene glycol. The polyethylene glycol has the structure: H—[OCH$_2$CH$_2$]$_n$—OH wherein n is an integer of from 2 to about 500. The polyethylene glycol can have any suitable molecular weight, for example, the polyethylene glycol can have a molecular weight of about 100 g/mol to about 20,000 g/mol.

The polishing composition can comprise any suitable concentration of polyethylene glycol at the point-of-use. The polishing composition can comprise about 1 ppm or more of polyethylene glycol at the point-of-use, e.g., about 5 ppm or more, about 10 ppm or more, about 15 ppm or more, about 20 ppm or more, about 25 ppm or more, about 30 ppm or more, about 35 ppm or more, about 40 ppm or more, about 45 ppm or more, or about 50 ppm or more, of the polyethylene glycol. Alternatively, or in addition, the polishing composition can comprise about 1000 ppm or less of polyethylene glycol at the point-of-use, e.g., about 900 ppm or less, about 800 ppm or less, about 700 ppm or less, about 600 ppm or less, or about 500 ppm or less, of the polyethylene glycol. Thus, the polishing composition can comprise the polyethylene glycol in an amount bounded by any two of the aforementioned endpoints at the point-of-use. For example, the polishing composition can comprise about 1 ppm to about 1000 ppm of polyethylene glycol at the point-of-use, e.g., about 10 ppm to about 900 ppm, about 20 ppm to about 800 ppm, about 50 ppm to about 700 ppm, about 50 ppm to about 600 ppm, or about 50 ppm to about 500 ppm, of the polyethylene glycol, and the like.

The chemical-mechanical polishing composition optionally comprises one or more nonionic polymers that are different from the polyvinyl alcohol and the polyethylene glycol. In accordance with an embodiment of the invention, the polishing composition comprises one or more nonionic polymers selected from polyalkylene glycols, polyetheramines, polyethylene oxide/polypropylene oxide copolymers, polyacrylamide, polyvinylpyrrolidone, siloxane polyalkyleneoxide copolymers, hydrophobically modified polyacrylate copolymers, hydrophilic nonionic polymers, polysaccharides, and mixtures thereof. The nonionic polymers are preferably water-soluble and compatible with other components of the polishing composition. In some embodiments, the nonionic polymer functions as a surfactant and/or wetting agent.

The chemical-mechanical polishing composition can comprise one or more compounds capable of adjusting (i.e., that adjust) the pH of the polishing composition (i.e., pH adjusting compounds). The pH of the polishing composition can be adjusted using any suitable compound capable of adjusting the pH of the polishing composition. The pH adjusting compound desirably is water-soluble and compatible with the other components of the polishing composition. Typically, the chemical-mechanical polishing composition has a pH of about 1 to about 7 at the point-of-use. Preferably, the chemical-mechanical polishing composition has a pH of about 1 to about 4.5 at the point-of-use, e.g, about 2 to about 4 or about 3 to 4.

Ionic polymers of formula (I) are acidic in nature. As a consequence, the inventive polishing composition can be formulated to provide buffering capability. Typically, buffering of the polishing composition can be accomplished by addition of a basic compound or compounds to adjust the pH value of the polishing composition to a value in the range of the pKa value or pKa values of the ionic polymer(s). Any suitable basic compound may be used to adjust the pH value to provide for buffering capability. Non-limiting examples of suitable basic compounds include sodium hydroxide, potassium hydroxide, ammonium hydroxide, and organic amines such as triethanolamine.

In other embodiments, it is desirable that the polishing composition comprises a compound other than the ionic polymer that is capable of adjusting the pH and which is separately capable of buffering an acidic pH of the polishing composition. Accordingly, in these embodiments, it is desirable that the pH of the polishing composition is less than 7.0 (e.g., 6.5+/−0.5, 6.0+/−0.5, 5.5+/−0.5, 5.0+/−0.5, 4.5+/−0.5, 4.0+/−0.5, 3.5+/−0.5, 3.0+/−0.5, 2.5+/−0.5, 2.0+/−0.5, 1.5+/−0.5, or 1.0+/−0.5). Typically, the pH of the polishing composition in these embodiments is about 1 to about 4.5 at the point-of-use. Thus, the compound capable of adjusting the pH of the polishing composition typically has at least one ionizable group having a pKa of about 3 to about 7 when measured at 25° C.

The compound capable of adjusting and buffering the pH can be selected from the group consisting of ammonium salts, alkali metal salts, carboxylic acids, alkali metal hydroxides, alkali metal carbonates, alkali metal bicarbonates, borates, and mixtures thereof.

The chemical-mechanical polishing composition optionally further comprises one or more additives. Illustrative additives include conditioners, acids (e.g., sulfonic acids), complexing agents (e.g., anionic polymeric complexing agents), chelating agents, biocides, scale inhibitors, dispersants, etc.

A biocide, when present, can be any suitable biocide and can be present in the polishing composition in any suitable amount. A suitable biocide is an isothiazolinone biocide. The amount of biocide used in the polishing composition typically is about 1 to about 50 ppm, preferably about 10 to about 20 ppm.

It will be understood that any of the components of the polishing composition that are acids, bases, or salts (e.g., ionic polymer, polyhydroxy aromatic carboxylic acid, base, and/or alkali metal carbonate, etc.), when dissolved in the water of the polishing composition, can exist in dissociated form as cations and anions. The amounts of such compounds present in the polishing composition as recited herein will be understood to refer to the weight of the undissociated compound used in the preparation of the polishing composition.

In another embodiment, the invention provides a chemical-mechanical polishing composition comprising, consisting essentially of, or consisting of (a) a wet-process ceria abrasive, (b) a polyhydroxy aromatic carboxylic acid, and (c) water, wherein the polishing composition has a pH of about 1 to about 4.5. The wet-process ceria and polyhydroxy aromatic carboxylic acid can be as described herein.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., ceria abrasive, ionic polymer, polyhydroxy aromatic carboxylic acid, optional polyvinyl alcohol, optional polyethylene glycol, optional pH adjustor, and/or any optional additive) as well as any combination of ingredients (e.g., ceria abrasive, ionic polymer, polyhydroxy aromatic carboxylic acid, optional polyvinyl alcohol, optional polyethylene glycol, optional pH adjustor, etc.).

For example, the polishing composition can be prepared by (i) providing all or a portion of the liquid carrier, (ii) dispersing the ceria abrasive, ionic polymer, polyhydroxy aromatic carboxylic acid, optional polyvinyl alcohol, optional polyethylene glycol, optional pH adjustor, and/or any optional additive, using any suitable means for preparing such a dispersion, (iii) adjusting the pH of the dispersion as appropriate, and (iv) optionally adding suitable amounts of any other optional components and/or additives to the mixture.

Alternatively, the polishing composition can be prepared by (i) providing one or more components (e.g., liquid carrier, ionic polymer, polyhydroxy aromatic carboxylic acid, optional polyvinyl alcohol, optional polyethylene glycol, optional pH adjustor, and/or any optional additive) in a cerium oxide slurry, (ii) providing one or more components in an additive solution (e.g., liquid carrier, ionic polymer, polyhydroxy aromatic carboxylic acid, optional polyvinyl alcohol, optional polyethylene glycol, optional pH adjustor, and/or any optional additive), (iii) combining the cerium oxide slurry and the additive solution to form a mixture, (iv) optionally adding suitable amounts of any other optional additives to the mixture, and (v) adjusting the pH of the mixture as appropriate.

The polishing composition can be supplied as a one-package system comprising a ceria abrasive, ionic polymer, polyhydroxy aromatic carboxylic acid, optional polyvinyl alcohol, optional polyethylene glycol, optional pH adjustor, and/or any optional additive, and water. Alternatively, the polishing composition of the invention is supplied as a two-package system comprising a cerium oxide slurry and an additive solution, wherein the ceria oxide slurry consists essentially of, or consists of, a ceria abrasive, polyhydroxy aromatic carboxylic acid, optional polyvinyl alcohol, optional polyethylene glycol, optional pH adjustor, and/or any optional additive, and water, and wherein the additive solution consists essentially of, or consists of, ionic polymer, polyhydroxy aromatic carboxylic acid, optional polyvinyl alcohol, optional polyethylene glycol, optional pH adjustor, and/or any optional additive. The two-package system allows for the adjustment of substrate global flattening characteristics and polishing speed by changing the blending ratio of the two packages, i.e., the cerium oxide slurry and the additive solution.

Various methods can be employed to utilize such a two-package polishing system. For example, the cerium oxide slurry and additive solution can be delivered to the polishing table by different pipes that are joined and connected at the outlet of supply piping. The cerium oxide slurry and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

Similarly, a three-, four-, or more package system can be utilized in connection with the invention, wherein each of multiple containers contains different components of the inventive chemical-mechanical polishing composition, one or more optional components, and/or one or more of the same components in different concentrations.

In order to mix components contained in two or more storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). By the term "flow line" is meant a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if the components are combined about 5 minutes or less prior to being added in mixed form onto the platen, for example, about 4 minutes or less, about 3 minutes or less, about 2 minutes or less, about 1 minute or less, about 45 s or less, about 30 s or less, about 10 s or less prior to being added in mixed form onto the platen, or simultaneously to the delivery of the components at the point-of-use (e.g., the components are combined at a dispenser). Components also are combined "immediately before delivery to the point-of-use" if the components are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the ceria abrasive, polyhydroxy aromatic carboxylic acid, optional polyvinyl alcohol, optional polyethylene glycol, optional pH adjustor, and/or any optional additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, 4 equal volumes of water, or 5 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the ceria abrasive, polyhydroxy aromatic carboxylic acid, optional polyvinyl alcohol, optional polyethylene glycol, optional pH adjustor, and/or any optional additive are at least partially or fully dissolved in the concentrate.

The invention also provides a method of chemically-mechanically polishing a substrate comprising (i) contacting a substrate with a polishing pad and the chemical-mechanical polishing composition as described herein, (ii) moving the polishing pad relative to the substrate with the chemical-mechanical polishing composition therebetween, and (iii) abrading at least a portion of the substrate to polish the substrate.

The chemical-mechanical polishing composition can be used to polish any suitable substrate and is especially useful for polishing substrates comprising at least one layer (typically a surface layer) comprised of a low dielectric material. Suitable substrates include wafers used in the semiconductor industry. The wafers typically comprise or consist of, for example, a metal, metal oxide, metal nitride, metal composite, metal alloy, a low dielectric material, or combinations thereof. The method of the invention is particularly useful for polishing substrates comprising silicon oxide, silicon nitride, and/or polysilicon, e.g., any one, two, or especially all three of the aforementioned materials.

In certain embodiments, the substrate comprises polysilicon in combination with silicon oxide and/or silicon nitride. The polysilicon can be any suitable polysilicon, many of which are known in the art. The polysilicon can have any suitable phase, and can be amorphous, crystalline, or a combination thereof. The silicon oxide similarly can be any suitable silicon oxide, many of which are known in the art. Suitable types of silicon oxide include but are not limited to TEOS, borophosphosilicate glass (BPSG), PETEOS, thermal oxide, undoped silicate glass, and HDP oxide.

The chemical-mechanical polishing composition of the invention desirably exhibits a high removal rate when polishing a substrate comprising silicon oxide according to a method of the invention. For example, when polishing silicon wafers comprising high density plasma (HDP) oxides and/or plasma-enhanced tetraethyl ortho silicate (PETEOS) and/or tetraethyl orthosilicate (TEOS) in accordance with an embodiment of the invention, the polishing composition desirably exhibits a removal rate of silicon oxide of about 500 Å/min or higher, e.g., about 700 Å/min or higher, about 1,000 Å/min or higher, about 1,250 Å/min or higher, about 1,500 Å/min or higher, about 1,750 Å/min or higher, about 2,000 Å/min or higher, about 2,500 Å/min or higher, about 3,000 Å/min or higher, or about 3,500 Å/min or higher. In an embodiment, the removal rate for silicon oxide can be about 4,000 Å/min or higher, e.g., about 4,500 Å/min or higher, or about 5,000 Å/min or higher.

The chemical-mechanical polishing composition of the invention desirably exhibits a low removal rate when polishing a substrate comprising silicon nitride according to a method of the invention. For example, when polishing silicon wafers comprising silicon nitride in accordance with an embodiment of the invention, the polishing composition desirably exhibits a removal rate of silicon nitride of about 250 Å/min or lower, e.g., about 200 Å/min or lower, about 150 Å/min or lower, about 100 Å/min or lower, about 75 Å/min or lower, about 50 Å/min or lower, or about 25 Å/min or lower.

The chemical-mechanical polishing composition of the invention desirably exhibits a low removal rate when polishing a substrate comprising polysilicon according to a method of the invention. For example, when polishing silicon wafers comprising polysilicon in accordance with an embodiment of the invention, the polishing composition desirably exhibits a removal rate of polysilicon of about 1,000 Å/min or lower, e.g., about 750 Å/min or lower, about 500 Å/min or lower, about 250 Å/min or lower, about 100 Å/min or lower, about 50 Å/min or lower, about 25 Å/min or lower, about 10 Å/min or lower, or about 5 Å/min or lower.

Without wishing to be bound by any particular theory, it is believed that, as when polishing of silicon oxide on a patterned substrate comprising silicon oxide layered over silicon nitride progresses, the surface of the silicon oxide becomes more basic as polishing progresses. The ceria particles of the polishing composition typically have a net positive charge at the pH of the polishing composition. As the silicon oxide surface becomes more basic, polyhydroxycarboxylic acid present near the silicon oxide surface becomes at least partially deprotonated and develops a net negative charge as polishing progresses. The negatively charged molecules of polyhydroxycarbolic acid then associate with the ceria particles, thereby reducing the polishing action of the ceria particles. Thus, as the substrate approaches planarity, i.e., wherein silicon nitride is exposed and silicon oxide remains in the patterned features, the remaining silicon oxide is protected from overpolishing and thus from dishing.

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSW1, SPM3100 (commercially available from, for example, Eminess Technologies), POLITEX™, and Fujibo POLYPAS™ 27. A particularly preferred polishing pad is the EPIC™ D100 pad commercially available from Cabot Microelectronics. Another preferred polishing pad is the IC1010 pad available from Dow, Inc.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

The following examples further illustrate the invention but, of course, should not be construed as in any way limiting its scope.

In the following examples, substrates, TEOS silicon oxide (prepared from tetraethoxysilane) coated on silicon, HDP (high density plasma) silicon oxide coated on silicon, polysilicon coated on silicon, and silicon nitride coated on silicon, and patterned wafers obtained from Silyb Inc. were polished using either a MIRRA™ (Applied Materials, Inc.) or a REFLEXION™ (Applied Materials, Inc.) tool. The patterned wafers comprised 100 μm silicon nitride features on silicon oxide-coated substrates. An IC 1010™ polishing pad (Dow Chemical) was used with identical polishing parameters for all compositions. The polishing parameters are as follows: IC1010™ pad, 20.68 kPa (3 psi) downforce, 85 rpm headspeed, 100 rpm platen speed, 150 mL/min total flow rate. Removal rates were calculated by measuring the film thickness using spectroscopic ellipsometry, and subtracting the final thickness from the initial thickness.

Example 1

This example demonstrates the reduced nitride loss and dishing exhibited by a polishing composition including a polyethylene glycol dicarboxylic acid and 3,5-dihydroxybenzoic acid according to the invention.

Three separate patterned substrates comprising 100 μm silicon nitride features on silicon oxide-coated substrates were polished with three different polishing compositions, i.e., Polishing Compositions 1A-1C. Each of Polishing Compositions 1A-1C contained 0.2 wt. % wet-process ceria in water at a pH of 3.6. Polishing Composition 1A also contained 100 ppm of a polyethylene glycol dicarboxylic acid and 250 ppm of 3,5-dihydroxybenzoic acid. Polishing Composition 1B also contained 300 ppm of a polyethylene glycol dicarboxylic acid and 100 ppm of 3,5-dihydroxybenzoic acid. Polishing Composition 1C also contained no polyethylene glycol dicarboxylic acid, but contained 450 ppm of 3,5-dihydroxybenzoic acid. Polishing was conducted to endpoint (EP) plus 40%, where endpoint was the time to expose the SiN layer.

Following polishing, the silicon nitride loss and dishing at the 100 μm×100 μm features (dishing within the trenches) were determined. The results are set forth in Table 1.

TABLE 1

Nitride Loss and Dishing

| Polishing Composition | Polishing Time (s) (EP + 40%) | SiN Loss (Å) | Dishing (Å) |
|---|---|---|---|
| 1A (invention) | 91 | 1 | 282 |
| 1B (invention) | 72.8 | 8 | 424 |
| 1C (invention) | 116.2 | 34 | 324 |

As is apparent from the results set forth in Table 1, Polishing Composition 1A, which contained 100 ppm of a polyethylene glycol dicarboxylic acid and 250 ppm of 3,5-dihydroxybenzoic acid, and Polishing Composition 1B, which contained 300 ppm of a polyethylene glycol dicarboxylic acid and 100 ppm of 3,5-dihydroxybenzoic acid, exhibited very low SiN loss. Polishing Composition 1C, which contained 400 ppm of 3,5-dihydroxybenzoic acid but no polyethylene glycol dicarboxylic acid, exhibited approximately 76% of the dishing exhibited by Polishing Composition 1B.

Example 2

This example demonstrates the improved SiO removal rates exhibited by a polishing composition including 3,5-dihydroxybenzoic acid according to the invention.

Separate substrates comprising a blanket layer of TEOS or HDP (high density plasma silicon oxide) were polished with two different polishing compositions, Polishing Compositions 2A and 2B. Polishing Composition 2A (comparative) comprised 0.2 wt. % wet-process ceria, a polyethylene glycol dicarboxylic acid, and a polyvinyl alcohol in water at a pH of 3.6. Polishing Composition 2B (inventive) comprised all of the components of Polishing Composition 2A in the same amounts included in Polishing Composition 2A, and further comprised 3,5-dihydroxybenzoic acid.

Following polishing, the removal rates were determined, and the results set forth in Table 2.

TABLE 2

SiO Removal Rates

| Polishing Composition | TEOS Removal Rate (Å/min) | HDP Removal Rate (Å/min) |
|---|---|---|
| 2A (comparative) | 3300 | 2600 |
| 2B (inventive) | 3800 | 3000 |

As is apparent from the results set forth in Table 2, Polishing Composition 2B, which comprised 3,5-dihydroxybenzoic acid, exhibited a removal rate of both TEOS and HDP that was approximately 115% of the removal rate exhibited by Polishing Composition 2A.

Example 3

This example demonstrates the reduced nitride loss and dishing exhibited by a polishing composition including of 3,5-dihydroxybenzoic acid according to the invention.

Separate patterned substrates comprising 100 μm silicon nitride features on silicon oxide-coated substrates were polished with two different polishing compositions, i.e., Polishing Compositions 2A and 2B, as described in Example 2.

Substrates were polished for 53 sec to endpoint +16 sec polishing after exposure of the SiN layer. Following polishing, the silicon nitride loss and dishing at the 100 μm×100 μm features (dishing within the trenches) were determined. The results are set forth in Table 3.

TABLE 3

Nitride Loss and Dishing

| Polishing Composition | SiN Loss (Å) | Dishing (Å) |
|---|---|---|
| 2A (comparative) | 42 | 846 |
| 2B (inventive) | 20 | 550 |

As is apparent from the results set forth in Table 3, the presence of 3,5-dihydroxybenzoic acid in Polishing 2B resulted in SiN loss and dishing that were approximately 48% and 65%, respectively, of the SiN loss and dishing that were exhibited by Polishing Composition 2A, which did not contain 3,5-dihydroxybenzoic acid.

Example 4

This example demonstrates the reduced nitride loss and dishing exhibited by a polishing composition including of ceria, 3,5-dihydroxybenzoic acid, polyethylene glycol and polyvinyl alcohol according to the invention.

Separate patterned substrates comprising 100×100 μm silicon nitride features on silicon oxide-coated substrates were polished with composition 3A for three different polish times. Polishing Composition 3A contained 0.2% ceria, 60 ppm of a polyethylene glycol, 1200 ppm of poly vinyl alcohol and 60 ppm of 3,5-dihydroxybenzoic acid. Polishing was conducted to endpoint (EP) plus 10%, 20% and 30% over polish, where endpoint was the time to expose the SiN layer.

Following polishing, the silicon nitride loss and dishing at the 100 μm×100 μm features (dishing within the trenches) were determined. The results are set forth in Table 4.

TABLE 4

Nitride Loss and Dishing

| Over Polishing Time | SiN Loss (Å) | Dishing (Å) |
|---|---|---|
| 10% | 18 | 146 |
| 20% | 25 | 191 |
| 30% | 30 | 261 |

As is apparent from the results set forth in Table 4, the presence of 3,5-dihydroxybenzoic acid, polyethylene glycol and polyvinyl alcohol in a polishing composition with ceria resulted in very low SiN loss and dishing compared to earlier examples.

Example 5

This example compares the removal rates exhibited by polishing compositions including 3,4-dihydroxybenzoic acid or 3,5-dihydroxybenzoic acid according to the invention.

Separate substrates comprising blanket layers of TEOS, HDP, and SiN were polished with two different polishing compositions, i.e., Polishing Compositions 4A and 4B. Each of Polishing Compositions 4A and 4B comprised 0.2 wt. % wet-process ceria, a polyethylene glycol dicarboxylic acid, and a polyvinyl alcohol in water at a pH of 3.6. Polishing Composition 4A further comprised 3,4-dihydroxybenzoic acid. Polishing Composition 4B further comprised 3,5-dihydroxybenzoic acid.

Following polishing, the removal rates were determined, and the results are set forth in Table 4.

TABLE 4

Removal Rates

| Polishing Composition | TEOS Removal Rate (Å/min) | HDP Removal Rate (Å/min) | SiN Removal Rate (Å/min) |
|---|---|---|---|
| 4A (inventive) | 550 | 578 | 7 |
| 4B (inventive) | 2195 | 2141 | 10 |

As is apparent from the results set forth in Table 4, Polishing Composition 4B exhibited approximately a four-fold higher removal rate for both TEOS and HDP, and an approximately 1.4 times higher removal rate for SiN as compared to Polishing Composition 4A. Both of Polishing Compositions 4A and 4B provided acceptable TEOS and HDP removal rates while exhibiting low SiN removal rates.

Example 6

This example compares the removal rates as a function of time exhibited by a polishing composition including 3,4-dihydroxybenzoic acid or 3,5-dihydroxybenzoic acid, according to the invention.

Separate patterned substrates comprising 100 μm silicon nitride features on silicon oxide-coated substrates were polished with two different polishing compositions, i.e., Polishing Compositions 4A and 4B, as described in Example 5.

Substrates were polished for 45 seconds and 60 seconds. Following polishing, the oxide removed at the 100 μm×100 μm features (oxide within the trenches) was determined. The results are set forth in Table 5.

TABLE 5

SiO Removal over Time

| Polishing Composition | Polishing Time | SiO Removed (Å) |
|---|---|---|
| 4A | 45 | 1150 |
| 4A | 60 | 1230 |
| 4B | 45 | 2082 |
| 4B | 60 | 2620 |

As is apparent from the results set forth in Table 5, a 15 second increase in polishing time with Polishing Composition 4A resulted in an approximately 7% increase in SiO removal. A 15 second increase in polishing time with Polishing Composition 4B from 30 sec to 45 sec resulted in an approximately 26% increase in SiO removal. The amount of SiO removed after polishing for 45 seconds was approximately 2.1 times greater for Polishing Composition 4B as compared to Polishing Composition 4A.

Example 7

This example demonstrates the stability of an exemplary concentrated polishing composition, in accordance with an embodiment of the invention.

A polishing composition comprising 1.2 wt. % wet-process ceria, 3,5-dihydroxybenzoic acid, a polyethylene glycol dicarboxylic acid, and a polyvinyl alcohol was stored at 45° C. for 50 days. The sample was periodically sampled and the zeta potential and particle size were determined. The results are illustrated graphically in FIG. 1 and FIG. 2.

As is apparent from the results shown in FIG. 1 and FIG. 2, the zeta potential remained stable between about 23 and 26 mV and the particle size remained stable between 110-125 nm during the 50 day storage period.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) a wet-process ceria abrasive,
   (b) a polyhydroxy aromatic carboxylic acid, wherein the polyhydroxy aromatic carboxylic acid is 3,5-dihydroxybenzoic acid,
   (c) optionally, an ionic polymer of formula (I):

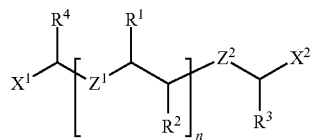

wherein $X^1$ and $X^2$ are independently selected from hydrogen, —OH, and —COOH and
   wherein at least one of $X^1$ and $X^2$ is —COOH,
   $Z^1$ and $Z^2$ are independently O or S,
   $R^1$, $R^2$, $R^3$, and $R^4$ are independently selected from hydrogen, $C_1$-$C_6$ alkyl, and $C_7$-$C_{10}$ aryl, and
   n is an integer of 3 to 500, and
   (d) water,
   wherein the polishing composition has a pH of about 1 to about 4.5.

2. The polishing composition of claim 1, wherein the wet-process ceria abrasive is present in an amount of about 0.05 wt. % to about 1 wt. % of the polishing composition.

3. The polishing composition of claim 1, wherein $X^1$ and $X^2$ are both —COOH.

4. The polishing composition of claim 3, wherein $Z^1$ and $Z^2$ are both O, and $R^1$, $R^2$, $R^3$, and $R^4$ are hydrogen.

5. The polishing composition of claim 1, wherein the ionic polymer has a molecular weight of about 500 daltons to about 10,000 daltons, and wherein n is an integer of 8 to 500.

6. The polishing composition of claim 1, wherein the ionic polymer is present in an amount of about 0.01 wt. % to about 0.5 wt. % of the polishing composition.

7. The polishing composition of claim 1, wherein the polishing composition further comprises a polyvinyl alcohol, wherein the polyvinyl alcohol is a branched polyvinyl alcohol having a molecular weight of about 20,000 daltons to about 200,000 daltons.

8. The polishing composition of claim 1, wherein the polishing composition further comprises a polyethylene glycol.

9. A method of chemically-mechanically polishing a substrate comprising:
   (i) providing a substrate,
   (ii) providing a polishing pad,
   (iii) providing a chemical-mechanical polishing composition comprising:
      (a) a wet-process ceria abrasive,
      (b) a polyhydroxy aromatic carboxylic acid, wherein the polyhydroxy aromatic carboxylic acid is 3,5-dihydroxybenzoic acid,
      (c) an ionic polymer of formula (I):

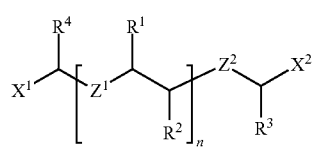

wherein $X^1$ and $X^2$ are independently selected from hydrogen, —OH, and —COOH,
      $Z^1$ and $Z^2$ are independently O or S,
      $R^1$, $R^2$, $R^3$, and $R^4$ are independently selected from hydrogen, $C_1$-$C_6$ alkyl, and $C_7$-$C_{10}$ aryl, and
      n is an integer of 3 to 500, and
      (d) water,
      wherein the polishing composition has a pH of about 1 to about 4.5,
   (iv) contacting the substrate with the polishing pad and the polishing composition, and
   (v) moving the polishing pad and the chemical-mechanical polishing composition relative to the substrate to abrade at least a portion of the substrate to polish the substrate.

10. The method of claim 9, wherein the wet-process ceria abrasive is present in an amount of about 0.05 wt. % to about 1 wt. % of the polishing composition.

11. The method of claim 9, wherein the polyhydroxy aromatic carboxylic acid is 3,4-dihydroxybenzoic acid or 3,5-dihydroxybenzoic acid.

12. The method of claim 9, wherein $X^1$ and $X^2$ are both —COOH.

13. The method of claim 12, wherein $Z^1$ and $Z^2$ are both O, and $R^1$, $R^2$, $R^3$, and $R^4$ are hydrogen.

14. The method of claim 9, wherein the ionic polymer has a molecular weight of about 500 daltons to about 10,000 daltons, and wherein n is an integer of 8 to 500.

15. The method of claim 9, wherein the ionic polymer is present in an amount of about 0.01 wt. % to about 0.5 wt. % of the polishing composition.

16. The method of claim 9, wherein the polishing composition further comprises a polyvinyl alcohol, wherein the polyvinyl alcohol is a branched polyvinyl alcohol having a molecular weight of about 20,000 daltons to about 200.000 daltons.

17. The method of claim 9, wherein the polishing composition further comprises a polyethylene glycol.

18. The method of claim 9, wherein the substrate comprises silicon oxide, and wherein at least a portion of the silicon oxide is abraded to polish the substrate.

19. The method of claim 18, wherein the substrate further comprises silicon nitride, and wherein at least a portion of the silicon nitride is abraded to polish the substrate.

20. The method of claim 18, wherein the substrate further comprises polysilicon, and wherein at least a portion of the polysilicon is abraded to polish the substrate.

21. A chemical-mechanical polishing composition comprising:
   (a) a wet-process ceria abrasive,
   (b) a polyhydroxy aromatic carboxylic acid, wherein the polyhydroxy aromatic carboxylic acid is 3,5-dihydroxybenzoic acid,
   and
   (c) water, wherein the polishing composition has a pH of about 1 to about 4.5.

22. Composition of claim 21 further comprising one or more non-ionic polymers selected from the group of polyethylene glycols or polyvinyl alcohols.

23. A method of chemically-mechanically polishing a substrate comprising:
   (i) providing a substrate,
   (ii) providing a polishing pad,
   (iii) providing the chemical-mechanical polishing composition of claim 21,
   (iv) contacting the substrate with the polishing pad and the polishing composition, and
   (v) moving the polishing pad and the chemical-mechanical polishing composition relative to the substrate to abrade at least a portion of the substrate to polish the substrate.

* * * * *